(12) United States Patent
Nishiyama et al.

(10) Patent No.: US 7,705,515 B2
(45) Date of Patent: Apr. 27, 2010

(54) SURFACE ACOUSTIC WAVE DEVICE

(75) Inventors: Kenji Nishiyama, Yasu (JP); Takashi Nakao, Omihachiman (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/243,010

(22) Filed: Oct. 1, 2008

(65) Prior Publication Data

US 2009/0021107 A1    Jan. 22, 2009

Related U.S. Application Data

(63) Continuation of application No. PCT/JP2007/057557, filed on Apr. 4, 2007.

(30) Foreign Application Priority Data

Apr. 24, 2006    (JP) .............................. 2006-118950

(51) Int. Cl.
*H01L 41/18*  (2006.01)
*H01L 41/047* (2006.01)

(52) U.S. Cl. .............................. 310/313 A; 310/313 R; 310/313 B

(58) Field of Classification Search ............. 310/313 R, 310/313 A, 313 B, 313 C, 313 D
See application file for complete search history.

(56) References Cited

U.S. PATENT DOCUMENTS

| 7,339,304 B2 | 3/2008 | Kadota et al. |
| 2007/0007852 A1 | 1/2007 | Kando |
| 2007/0096592 A1 | 5/2007 | Kadota et al. |

FOREIGN PATENT DOCUMENTS

| DE | 11 2004 001 841 T5 | 9/2006 |
| JP | 2005-354430 A | 12/2005 |
| WO | WO2005/034347 | * 4/2005 |

OTHER PUBLICATIONS

Official Communication issued in International Patent Application No. PCT/JP2007/057557, mailed on Jul. 17, 2007.
Nishiyama et al.; "Surface Acoustic Wave Device"; U.S. Appl. No. 12/234,836; filed Sep. 22, 2008.
Official Communication issued in corresponding German Patent Application No. 11 2007 000 874.1, mailed Jan. 14, 2010.

* cited by examiner

*Primary Examiner*—Walter Benson
*Assistant Examiner*—Derek J Rosenau
(74) *Attorney, Agent, or Firm*—Keating & Bennett, LLP

(57) ABSTRACT

A surface acoustic wave device utilizing a Rayleigh wave includes a $LiNbO_3$ substrate having Euler angles of $(0°±5°, \theta±5°, 0°±10°)$, an electrode which is disposed on the $LiNbO_3$ substrate and which includes an IDT electrode primarily including Cu, a first silicon oxide film disposed in a region other than the region in which the electrode is disposed, the first silicon oxide film having a film thickness substantially equal to the thickness of the electrode, and a second silicon oxide film arranged to cover the electrode and the first silicon oxide film, wherein the film thickness of the electrode is within the range of about $0.12\lambda$ to about $0.18\lambda$, where $\lambda$ represents the wavelength of a surface acoustic wave, and $\theta$ of the above-described Euler angles of $(0°±5°, \theta±5°, 0°±10°)$ is in the range satisfying the following Formula (1):

$$\theta = 32.01 - 351.92 \times \exp(-T_{Cu}/0.0187) \quad \text{Formula (1)}$$

where $T_{Cu}$ is a value of Cu electrode film thickness normalized with the wavelength $\lambda$.

4 Claims, 6 Drawing Sheets

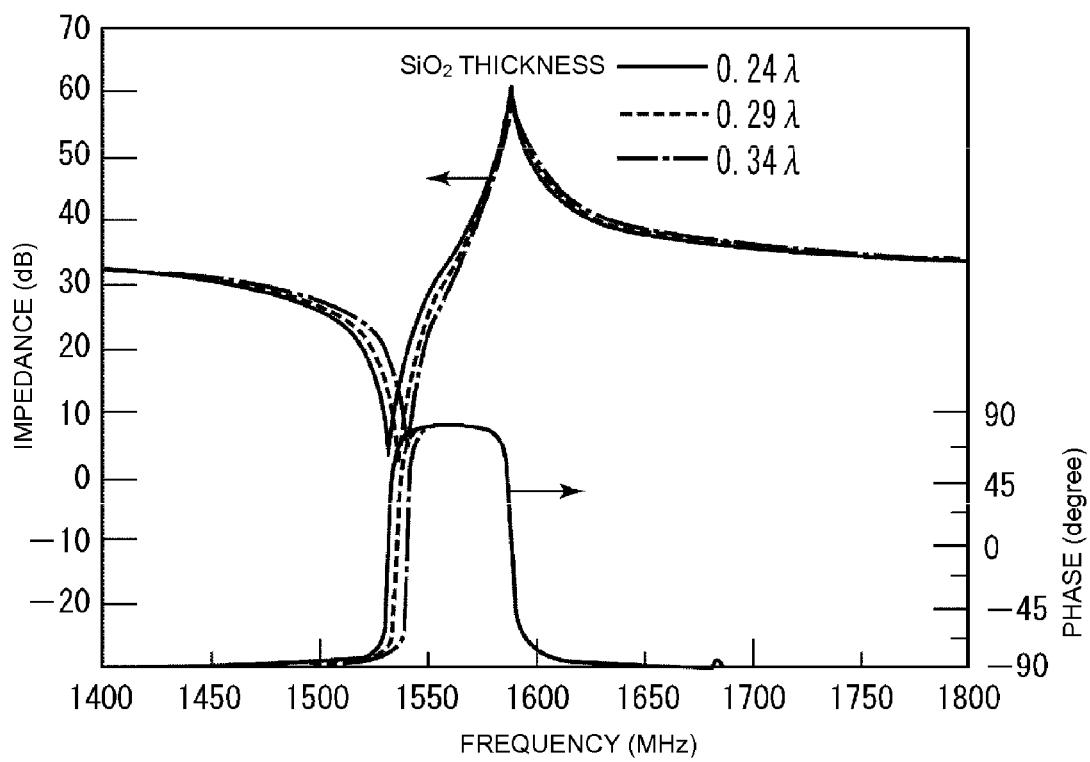

SURFACE ACOUSTIC WAVE DEVICE

BACKGROUND OF THE INVENTION

1. Field of the Invention

The present invention relates to a surface acoustic wave device used for, for example, a resonator and a band pass filter. In particular, the present invention relates to a surface acoustic wave device including an IDT electrode and a silicon oxide film disposed on a LiNbO$_3$ substrate and utilizing Rayleigh waves.

2. Description of the Related Art

Band pass filters used for RF stages of cellular phones and other electronic devices must be broadband and have good temperature characteristics. Therefore, a surface acoustic wave device in which an IDT electrode is disposed on a piezoelectric substrate made of a rotated Y-cut x-propagation LiTaO$_3$ substrate or a rotated Y-cut x-propagation LiNbO$_3$ substrate and a silicon oxide film arranged so as to cover the IDT electrode has been used. With this type of piezoelectric substrate, the temperature coefficient of resonant frequency has a negative value. Therefore, to improve the temperature characteristic, the silicon oxide film having a positive temperature characteristic of resonant frequency is arranged so as to cover the IDT electrode.

However, with this structure, when the IDT electrode is made of general-purpose Al or an alloy primarily including Al, a satisfactory reflection coefficient of the IDT electrode cannot be obtained. Consequently, there is a problem in that a ripple is likely to occur in the resonant characteristic.

To solve the above-described problems, WO2005-034347 discloses a surface acoustic wave device in which an IDT electrode primarily made of a metal having a density greater than that of Al is disposed on a piezoelectric substrate made of LiNbO$_3$ having an electromechanical coefficient K$^2$ of at least about 0.025, a first silicon oxide film having a film thickness substantially equal to the thickness of the electrode is disposed in a region other than the region in which the IDT electrode is disposed, and a second silicon oxide film is laminated so as to cover the electrode and the first silicon oxide film.

In the surface acoustic wave device described in WO2005-034347, the density of the above-described IDT electrode is specified to be at least about 1.5 times greater than the density of the first silicon oxide film, and the reflection coefficient of the IDT electrode is thereby satisfactorily increased and a ripple which occurs in the resonant characteristic is suppressed.

In WO2005-034347, the Rayleigh wave is used, Au, Cu, and other suitable materials may be used for the IDT electrode, a configuration in which when the electrode is made of Cu, the film thickness thereof is specified to be about 0.0058λ to about 0.11λ is disclosed, and in particular, if the film thickness is specified to be about 0.0058λ to about 0.055λ, the electromechanical coefficient K$^2$ of the Rayleigh wave can increase. Furthermore, a LiNbO$_3$ substrate represented by Euler angles of (0°±5°, 38°±10°, 0°) is disclosed, and a configuration in which the film thickness of the second silicon oxide film is specified to be within the range of about 0.15λ to about 0.4λ is shown, where the wavelength of the surface acoustic wave is λ.

In recent years, the frequencies used in surface acoustic wave devices have increased. Consequently, the pitch of electrode fingers of the IDT electrode has been reduced and the width dimension of the electrode finger itself has been reduced. As a result, the wiring resistance increases and the loss in the surface acoustic wave device increases.

An increase in film thickness of the electrode is sufficient to reduce the loss in the surface acoustic wave device. However, as described in, for example, WO2005-034347, in the past, with surface acoustic wave devices utilizing the Rayleigh wave, the film thickness of the IDT electrode made of Cu is specified to be a maximum of about 0.11λ. The reason for this is believed to be that if the film thickness of the IDT electrode made of Cu is increased to greater than about 0.11λ, the response of the SH wave significantly increases, and a large spurious response occurs between the resonant frequency and the anti-resonant frequency. Therefore, in WO2005-034347, when the IDT electrode is made of Cu, the thickness thereof is specified to be within the range of about 0.0058λ to about 0.11λ, and preferably about 0.058λ to about 0.055λ.

Consequently, when higher frequencies are used, the pitch of the electrode fingers is reduced, and the width dimension of electrode finger is reduced, the film thickness of the electrode cannot be sufficiently increased. Therefore, the wiring resistance increases and the loss increases.

Furthermore, as described above, with the surface acoustic wave device including the first and the second silicon oxide films, the temperature characteristic of resonant frequency is improved by the silicon oxide films. However, there is a problem in that the characteristic varies because of variations in film thickness of the silicon oxide films.

SUMMARY OF THE INVENTION

To overcome the problems described above, preferred embodiments of the present invention provide a surface acoustic wave device which utilizes Rayleigh waves, wherein an increase in the loss does not occur even when the pitch of the electrode fingers is reduced and the width dimension of electrode finger is reduced to utilize higher frequencies.

According to a preferred embodiment of the present invention, a surface acoustic wave device utilizing the Rayleigh wave is provided, the device includes a LiNbO$_3$ substrate represented by Euler angles of (0°±5°, θ±5°, 0°±10°), an electrode disposed on the LiNbO$_3$ substrate and which includes an IDT electrode primarily made of Cu, a first silicon oxide film disposed in a region other than the region in which the electrode is disposed, the first silicon oxide film having a film thickness substantially equal to the thickness of the electrode, and a second silicon oxide film arranged to cover the electrode and the first silicon oxide film, wherein the film thickness of the electrode is in the range of about 0.12λ to about 0.18λ, where λ represents the wavelength of a surface acoustic wave, and θ of the Euler angles of (0°±5°, θ±5°, 0°±10°) is in the range satisfying the following Formula (1).

Mathematical Formula 1

$$\theta = 32.01 - 351.92 \times \exp(-T_{Cu}/0.0187) \qquad \text{Formula (1)}$$

where T$_{Cu}$ is a value of Cu electrode film thickness normalized with the wavelength λ

Preferably, the film thickness H of the second silicon oxide film is in the range of about 0.15λ to about 0.50λ, and the electromechanical coefficient K$^2$ of the Rayleigh wave is at least about 6%, and a wider bandwidth is easily achieved.

According to preferred embodiments of the present invention, the electrode including an IDT electrode primarily including Cu is disposed on the LiNbO$_3$ substrate and the first and the second silicon oxide films are disposed, and the film thickness of the electrode is at least about 0.12λ. Therefore, the electrical resistance can be reduced and, the loss can be reduced even when higher frequencies are utilized. In addition, since θ of the Euler angles of the LiNbO$_3$ substrate is in the above-described specific range, the electromechanical coefficient of the Rayleigh wave is not significantly reduced.

Consequently, a broadband surface acoustic wave device which can be easily used in higher frequencies and which exhibits a reduced loss is provided.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 10 is a diagram showing the impedance characteristic and the phase characteristic of a surface acoustic wave device of a preferred embodiment when the film thickness of the second silicon oxide film is about 0.34λ, about 0.29λ, or about 0.24λ.

DETAILED DESCRIPTION OF PREFERRED EMBODIMENTS

Preferred embodiments of the present invention will be described with reference to the drawings.

Figure 1A:
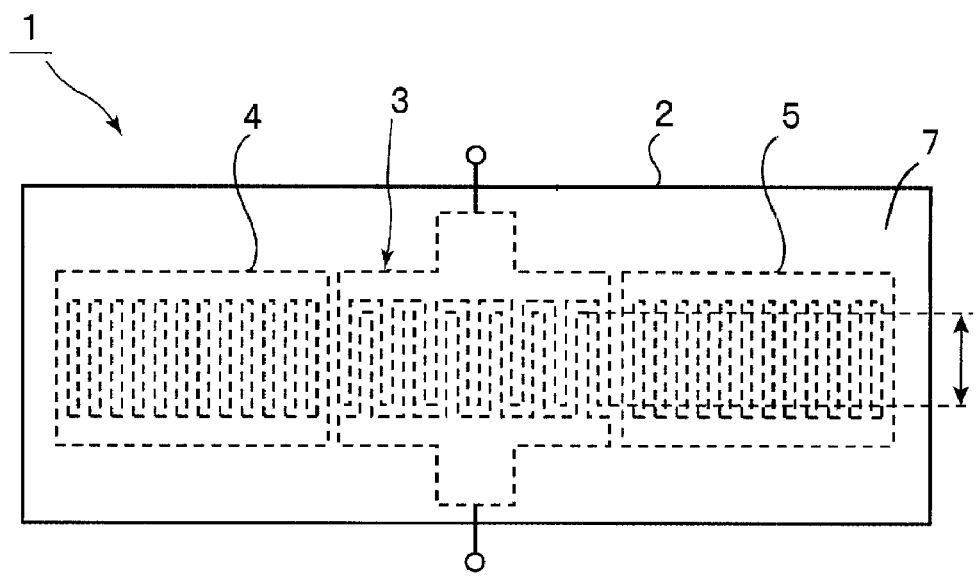
FIGS. 1A and 1B are a schematic plan view of a surface acoustic wave device according to a preferred embodiment of the present invention and a magnified partial cutaway front sectional view showing a portion thereof under magnification.
Figure 1B:
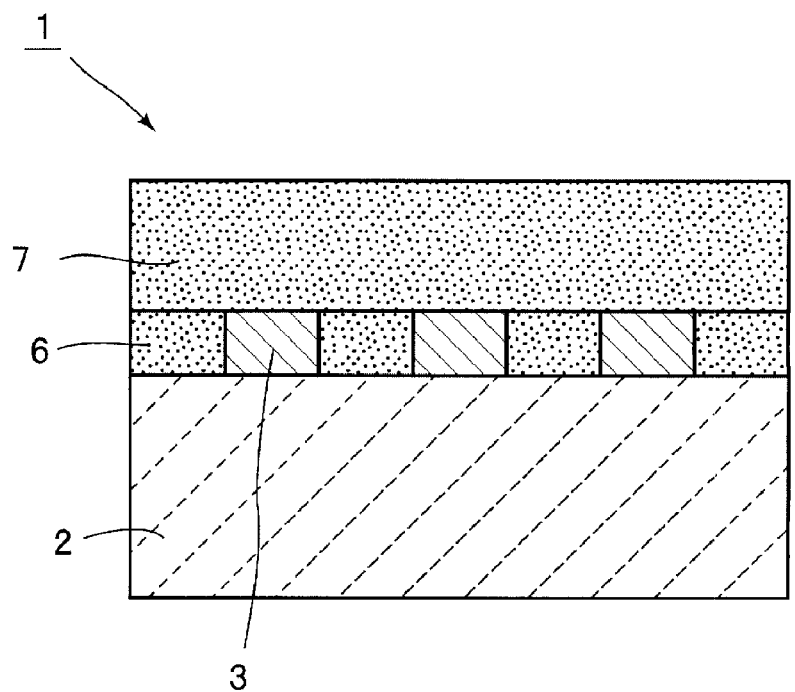

FIG. 1A is a schematic plan view of a surface acoustic wave device according to a preferred embodiment of the present invention, and FIG. 1B is a magnified partial cutaway front sectional view showing a portion thereof.

A surface acoustic wave device 1 is made using a rotated Y-cut x-propagation LiNbO$_3$ substrate 2. The crystal orientation of the LiNbO$_3$ substrate 2 is preferably specified by Euler angles of (0°±5°, θ, 0°±10°), for example.

Furthermore, as shown in FIG. 1B, an IDT electrode 3 is disposed on the LiNbO$_3$ substrate 2. As shown in FIG. 1A, reflectors 4 and 5 are disposed on both sides of the IDT electrode 3 in a surface acoustic wave propagation direction.

A first silicon oxide film 6 is disposed in a region other than the region in which the IDT electrode 3 and the reflectors 4 and 5 are disposed. The film thickness of the first silicon oxide film 6 is preferably substantially equal to the film thicknesses of the IDT electrode 3 and the reflectors 4 and 5. Furthermore, a second silicon oxide film 7 is arranged to cover the IDT electrode 3 and the reflectors 4 and 5 and the first silicon oxide film 6.

In the surface acoustic wave device 1, the LiNbO$_3$ substrate has a negative temperature coefficient of resonant frequency. On the other hand, the silicon oxide films 6 and 7 have positive temperature coefficients of resonant frequency. Therefore, the frequency characteristic can be improved.

In addition, the density of the electrode including the IDT electrode 3 is at least about 1.5 times greater than the density of the first silicon oxide film 6. That is, in the present preferred embodiment, the IDT electrode 3 is made of Cu. Therefore, the density of the IDT electrode 3 is about 8.93 g/cm$^3$. On the other hand, the density of the first silicon oxide film is about 2.21 g/cm$^3$.

Consequently, as is disclosed in WO2005-034347, the reflection coefficient of the IDT electrode 3 can be increased. It is thereby possible to suppress a ripple which appears in the resonant characteristic.

In the surface acoustic wave device 1 of the present preferred embodiment, the film thickness of the IDT electrode 3 is in the range of about 0.12λ to about 0.18λ, for example, where λ represents the wavelength of a surface acoustic wave, and θ of the Euler angles of (0°±5°, θ±5°, 0°±10°) of the LiNbO$_3$ substrate 2 is in the range satisfying the following Formula (1). That is, since the film thickness of the IDT electrode 3 is preferably at least about 0.12λ, the electrode resistance can be reduced. Consequently, the loss can be reduced even when higher frequencies are utilized. Furthermore, since θ of the Euler angles are in the specific range, the electromechanical coefficient of the Rayleigh wave is not significantly reduced.

Mathematical Formula 1

$$\theta = 32.01 - 351.92 \times \exp(-T_{Cu}/0.0187) \qquad \text{Formula (1)}$$

where $T_{Cu}$ is a value of Cu electrode film thickness normalized with the wavelength λ.

This will be described with reference to specific experimental examples.

FIRST EXPERIMENTAL EXAMPLE

Where the Rayleigh wave which is excited on the LiNbO$_3$ substrate 2 represented by the Euler angles of (0°, 20° to 50°, 0°) and the SH wave which is a spurious response, calculation was conducted by a finite element method. As shown in FIG. 1B, in a calculation model, the upper surface of a second silicon oxide film had a substantially flat structure, an IDT electrode was made of Cu, and first and second silicon oxide films 6 and 7 were made of SiO$_2$ films. The duty of the IDT electrode was set to about 0.50, and the film thickness of the SiO$_2$ film defining the second silicon oxide film 7 was set to a thickness of about 0.3λ.

Figure 2:
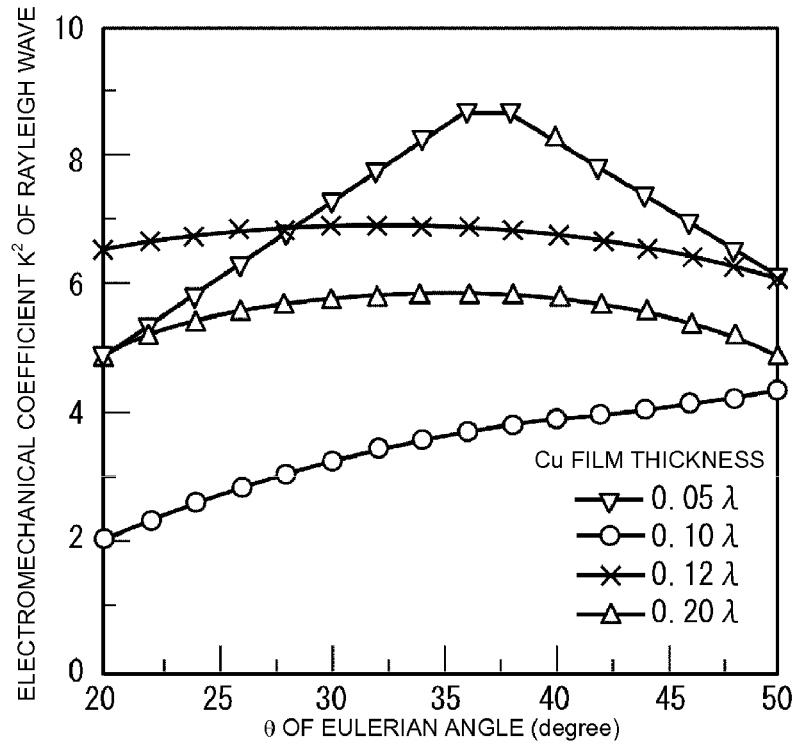
FIG. 2 is a diagram showing changes in electromechanical coefficient $K^2$ of the Rayleigh wave when the thickness of an IDT electrode made of Cu and θ of the Euler angles are changed.

Changes in the electromechanical coefficient $K^2$ of the Rayleigh wave when the film thickness of the IDT electrode 3 was about 0.05λ, about 0.10λ, about 0.12λ, or about 0.20λ and θ of the Euler angles was changed are shown in FIG. 2.

Figure 3:
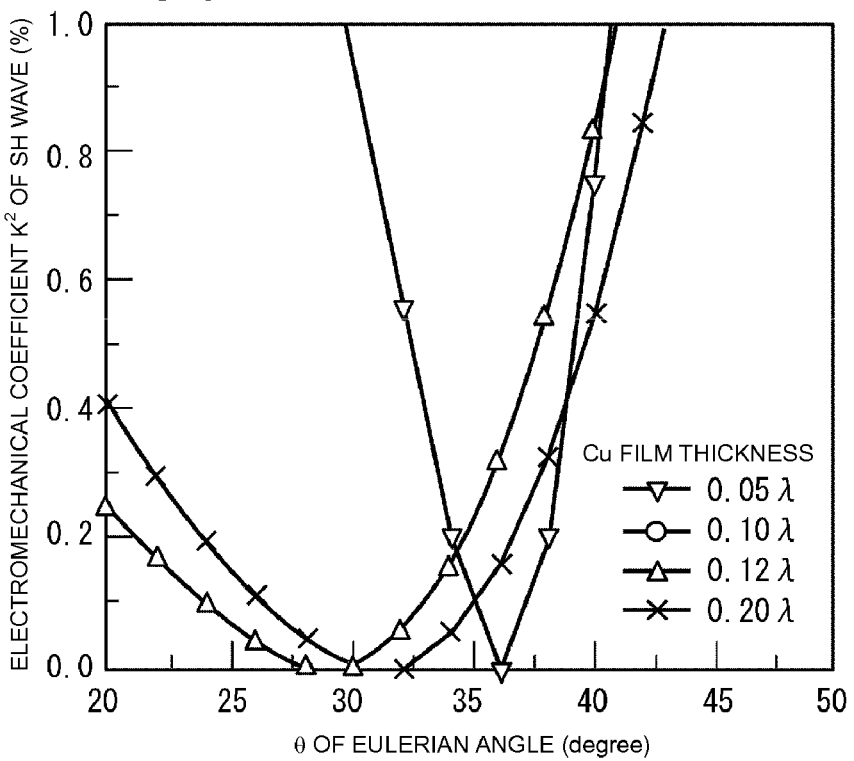
FIG. 3 is a diagram showing changes in electromechanical coefficient $K^2$ of the SH wave when the thickness of an IDT electrode made of Cu and θ of the Euler angles are changed.

Furthermore, changes in the electromechanical coefficient $K^2$ of the SH wave, which is a spurious response, when the film thickness of the IDT electrode was about 0.05λ, about 0.10λ, about 0.12λ, or about 0.20λ and θ of the Euler angles was changed are shown in FIG. 3.

As shown in FIGS. 2 and 3, when the film thickness of the IDT electrode 3 made of Cu is at least about 0.12λ, both of the dependence of the electromechanical coefficient $K^2$ of the Rayleigh wave and the dependence of the electromechanical coefficient $K^2$ of the SH wave on θ of the Euler angles change. That is, with respect to the Rayleigh wave, as shown in FIG. 2, when the film thickness of the IDT electrode is about 0.10λ or less, the electromechanical coefficient $K^2$ of the Rayleigh wave is relatively small, and when the film thickness is about 0.05λ, the electromechanical coefficient $K^2$ is significantly changed due to θ of the Euler angles. In contrast, when the film thickness of the IDT electrode is at least about 0.12λ, it is clear that the electromechanical coefficient $K^2$ of the Rayleigh wave is at least about 6%, and changes due to θ of the Euler angles are relatively small.

On the other hand, as shown in FIG. 3, the electromechanical coefficient $K^2$ of the SH wave significantly changes as θ of the Euler angles changes. Incidentally, when the film thickness of the IDT electrode 3 is about 0.05λ, the electromechanical coefficient $K^2$ of the SH wave, which is a spurious response, becomes a local minimum in the vicinity of θ=36°, whereas when the electrode film thickness is about 0.12λ or about 0.20λ, the electromechanical coefficient of the SH wave becomes a local minimum in the vicinity of θ=30°. When the film thickness of the IDT electrode is about 0.10λ, the electromechanical coefficient of the SH wave was about 5% when θ of the Euler angles was about 36° and, therefore, is not shown in FIG. 3.

Consequently, as shown in FIG. 3, θ at which the electromechanical coefficient $K^2$ of the SH wave spurious response becomes a minimum shifts from the vicinity of θ=36° to the vicinity of 30° when the film thickness of the IDT electrode made of Cu is at least about 0.12λ.

Previously, it was believed that when the Rayleigh wave is used, an SH wave spurious response increases as the film thickness of the IDT electrode 3 increases. That is, as described above, for example, when the electrode film thickness was about 0.10λ and θ of the Euler angles was about 36°, the electromechanical coefficient $K^2$ of the SH wave was about 5%.

On the other hand, when the film thickness is at least about 0.12λ, as shown in FIG. 3, the electromechanical coefficient $K^2$ of the SH wave is about 0.2% to about 0.4% when θ is in the vicinity of about 36°, but is about 0.1% or less in the range of θ=30°±5°, and about 0.05% or less in the vicinity of θ=30°.

Figure 4:
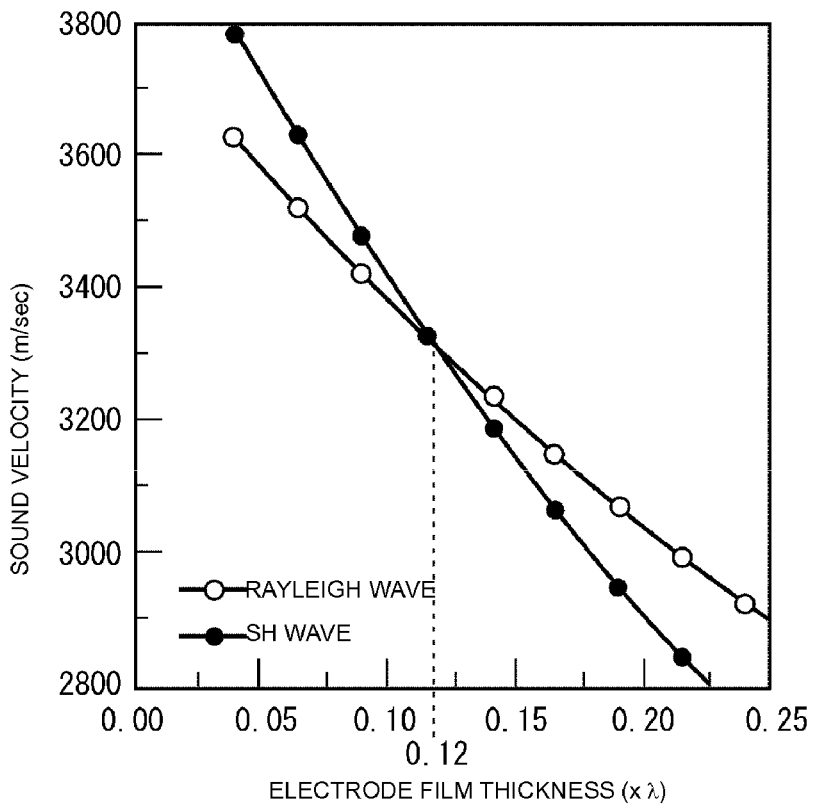
FIG. 4 is a diagram showing changes in sound velocities of the Rayleigh wave and the SH wave when the film thickness of the IDT electrode made of Cu is changed.

The reason the θ dependence of the electromechanical coefficient $K^2$ of the SH wave and the θ dependence of the electromechanical coefficient $K^2$ of the Rayleigh wave change at the border in the vicinity of a film thickness of the IDT electrode made of Cu of about 0.12λ, as described above, is believed to be that, as shown in FIG. 4, the sound velocity of the Rayleigh wave and the sound velocity of the SH wave intersect at a film thickness of the IDT electrode 3 of about 0.12λ. That is, as shown in FIG. 4, the sound velocities of the SH wave and the Rayleigh wave decrease as the film thickness of the IDT electrode increases, but when the film thickness is at least about 0.12λ, the sound velocity of the Rayleigh wave exceeds the sound velocity of the SH wave.

Therefore, as shown in FIGS. 2 and 3, it is believed that when the film thickness of the IDT electrode is at least about 0.12λ, the sound velocity of the above-described Rayleigh wave and the sound velocity of the SH wave are reversed and, thereby, the θ dependence of the electromechanical coefficient $K^2$ of the Rayleigh wave and the θ dependence of the electromechanical coefficient $K^2$ of the SH wave are changed.

Figure 5:
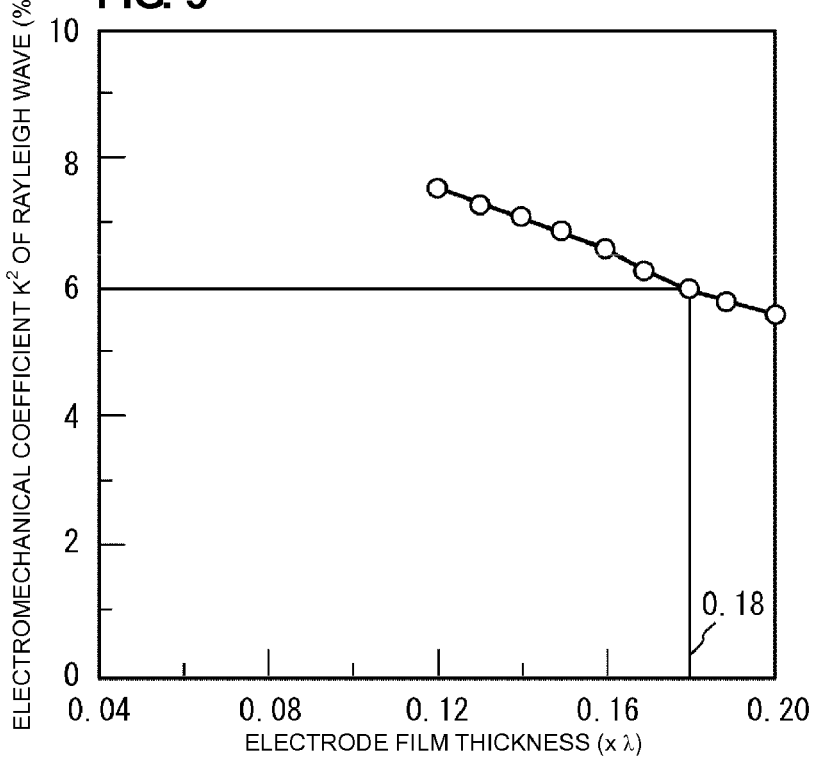
FIG. 5 is a diagram showing changes in electromechanical coefficient of the Rayleigh wave when the film thickness of the IDT electrode is changed.

FIG. 5 is a diagram showing changes in electromechanical coefficient $K^2$ of the Rayleigh wave due to the film thickness of the IDT electrode made of Cu. Here, the duty of the IDT electrode 3 was about 0.50, and the film thickness of a $SiO_2$ film defining the second silicon oxide film 7 was about 0.3λ.

As shown in FIG. 5, the electromechanical coefficient $K^2$ of the Rayleigh wave tends to decrease as the film thickness of the IDT electrode 3 made of Cu increases. However, it is clear that if the film thickness of the IDT electrode 3 is about 0.18λ or less, the electromechanical coefficient $K^2$ of the Rayleigh wave has a satisfactorily high value of at least about 6%. Therefore, the film thickness of the IDT electrode 3 must be about 0.18λ or less in order to enable the electromechanical coefficient $K^2$ to have a satisfactorily high value of at least about 6%.

In preferred embodiments of the present invention, the film thickness of the IDT electrode 3 made of Cu is at least about 0.12λ and, thereby, the film thickness of the IDT electrode is satisfactorily increased, and the electrode resistance is reduced. In this case, based on the results shown in FIGS. 2 and 3, a spurious response due to the SH wave can be satisfactorily reduced and, in addition, the electromechanical coefficient $K^2$ of the Rayleigh wave has a satisfactorily high value of at least about 6% by selecting θ of the Euler angles, as described below. In particular, the electromechanical coefficient $K^2$ of the Rayleigh wave can be increased to at least about 6% reliably by setting the film thickness of the IDT electrode to be about 0.18λ or less, as described above.

Figure 6:
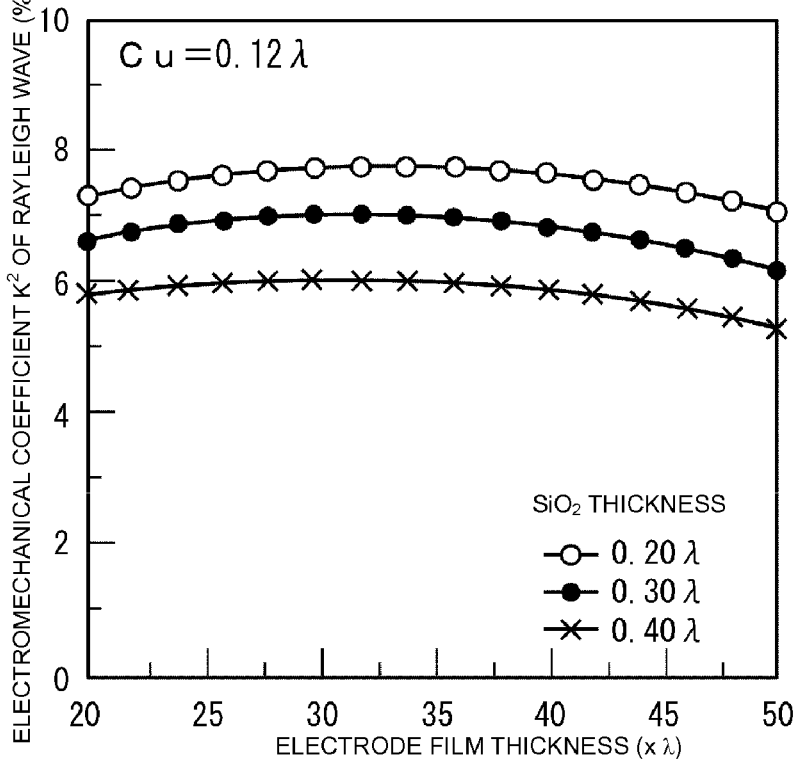
FIG. 6 is a diagram showing changes in electromechanical coefficient $K^2$ of the Rayleigh wave due to changes in θ of the Euler angles when the film thickness of the second silicon oxide film is about 0.2λ, about 0.3λ, or about 0.4λ.

FIG. 6 is a diagram showing changes in electromechanical coefficient $K^2$ of the Rayleigh wave due to θ of the Euler angles when the duty of the IDT electrode was about 0.50, the film thickness of the IDT electrode 3 made of Cu about 0.12λ, and the film thickness of a $SiO_2$ film defining the second silicon oxide film 7 was about 0.2λ, about 0.3λ, or about 0.4λ.

Figure 7:
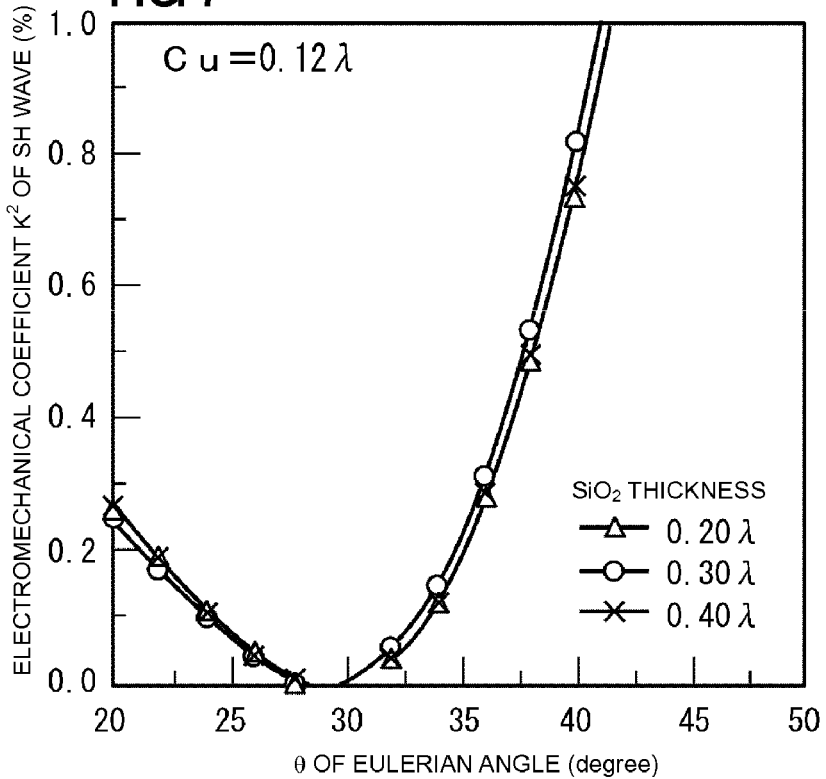
FIG. 7 is a diagram showing changes in electromechanical coefficient $K^2$ of the SH wave due to changes in θ of the Euler angles when the film thickness of the second silicon oxide film is about 0.2λ, about 0.3λ, or about 0.4λ.

Similarly to FIG. 6, FIG. 7 is a diagram showing changes in electromechanical coefficient $K^2$ of the SH wave due to θ of the Euler angles when the film thickness of the IDT electrode 3 made of Cu was about 0.12λ, the duty was about 0.50, and the film thickness of the second silicon oxide film was about 0.20λ, about 0.3λ, or about 0.4λ.

As shown in FIG. 6, in every case in which the film thickness of the second silicon oxide film is about 0.2λ, about 0.3λ, or about 0.4λ, even when the θ of the Euler angles are changed, the electromechanical coefficient $K^2$ of the Rayleigh wave does not significantly change and has a high value of at least about 6%. On the other hand, as shown in FIG. 7, the electromechanical coefficient $K^2$ of the SH wave changes significantly as θ of the Euler angles changes, and almost the same result is obtained in every case in which the film thickness of the second silicon oxide film is about 0.2λ, about 0.3λ, or about 0.4λ.

Consequently, as shown in FIGS. 6 and 7, even when the film thickness of the second silicon oxide film 7 is varied because of variations in production and other factors, the dependence of the Rayleigh wave and the dependence of the SH wave on θ of the Euler angles do not significantly change. Therefore, according to the above-described preferred embodiment, the surface acoustic wave device 1 having stable characteristics can be provided, wherein variations in the influence on the characteristics due to an SH wave spurious responses do not easily occur even when variations occur in thickness of the second silicon oxide film 7 made of a $SiO_2$ film.

Figure 8:
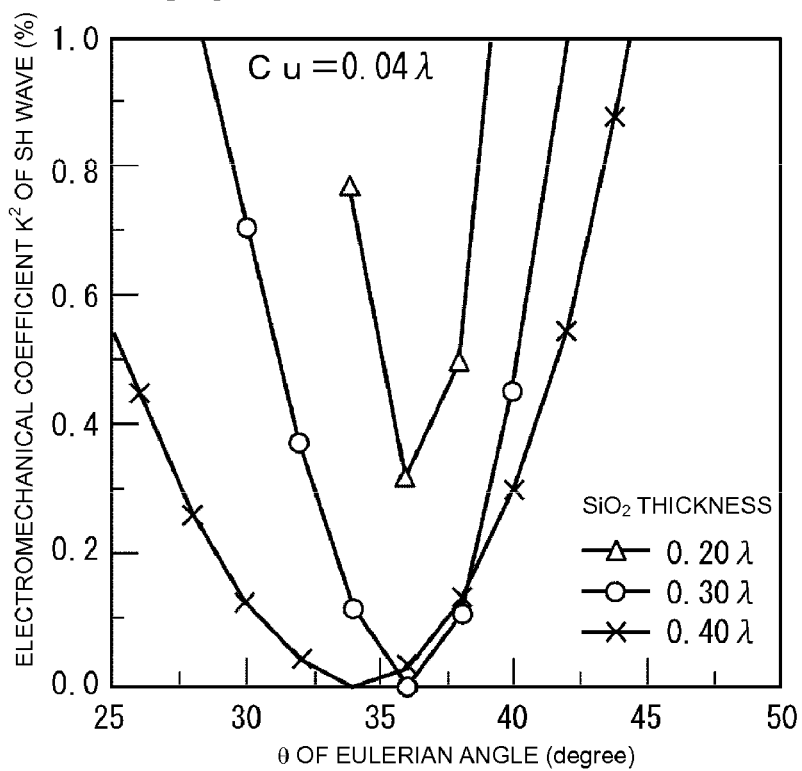
FIG. 8 is a diagram showing changes in electromechanical coefficient $K^2$ of the SH wave due to changes in θ of the Euler angles when the film thickness of the IDT electrode made of Cu is about 0.04λ and when the film thickness of the second silicon oxide film is about 0.2λ, about 0.3λ, or about 0.4λ.

FIG. 8 is a diagram showing changes in the electromechanical coefficient $K^2$ of the SH wave due to changes in θ of the Euler angles and the film thickness of the second silicon oxide film 7 when the film thickness of the IDT electrode 3 is about 0.04λ. As shown in FIG. 8, when the film thickness of the IDT electrode 3 made of Cu is about 0.04λ, changes in electromechanical coefficient $K^2$ of the SH wave due to θ of the Euler angles are very different between the case in which the film thickness of the second silicon oxide film 7 is about 0.2λ, the case in which the film thickness is about 0.3λ, and the case in which the film thickness is about 0.4λ. Consequently, it is clear that when the film thickness of the IDT electrode 3 is about 0.04λ, if the film thickness of the second silicon oxide film 7 varies, the characteristics significantly vary.

Since the SH wave is a spurious response, it is preferable that the electromechanical coefficient $K^2$ thereof is small. The value of θ at which the electromechanical coefficient $K^2$ of the SH wave is at a minimum is represented by the following Formula (1), where $T_{Cu}$ represents the film thickness of the IDT electrode 3 made of Cu. This Formula (1) was derived from the results shown in the above-described FIG. 3.

Mathematical Formula 1

$$\theta = 32.01 - 351.92 \times \exp(-T_{Cu}/0.0187)$$  Formula (1)

where $T_{Cu}$ is a value of Cu electrode film thickness normalized with the wavelength λ.

Furthermore, if the electromechanical coefficient $K^2$ of the SH wave is about 0.1% or less, very little influence is imposed by the spurious response. Consequently, it is preferable that θ represented by the above-described Formula (1) is within the range of about θ±5°. In that case, the electromechanical coefficient $K^2$ of the SH wave is about 0.1% or less.

Furthermore, as shown in FIG. 6, if the film thickness of the second silicon oxide film made of $SiO_2$ is within the range of about 0.2λ to about 0.4λ, the electromechanical coefficient K of the Rayleigh wave is at least about 6% over a wide range of θ of the Euler angles of about 20° to about 50°. According to the experiments conducted by the present inventors, it was determined that if the film thickness of the second silicon oxide film was within the range of about 0.15λ to about 0.5λ, the electromechanical coefficient $K^2$ of the Rayleigh wave was at least about 6%. Therefore, it is preferable that the film thickness of the second silicon oxide film is in the range of about 0.15λ to about 0.5λ, and more preferably in the range of about 0.2λ to about 0.4λ, as shown in FIG. 6.

Figure 9:
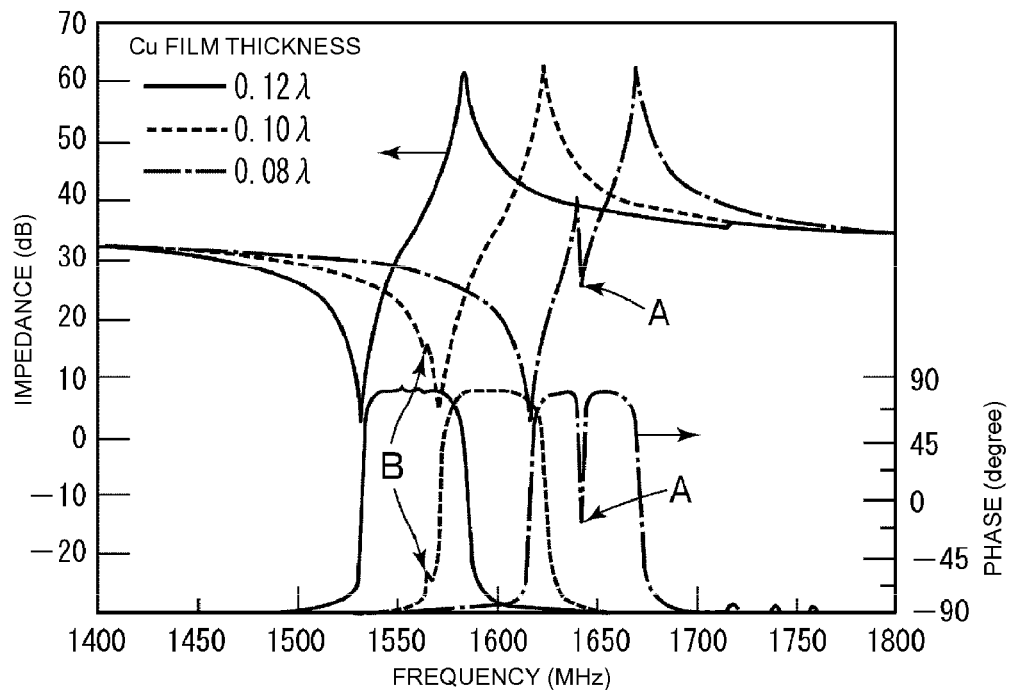
FIG. 9 is a diagram showing the impedance characteristic and the phase characteristic of surface acoustic wave devices according to a preferred embodiment and first and second comparative examples.

FIG. 9 shows the impedance characteristics and the phase characteristics of the surface acoustic wave device 1 of the above-described preferred embodiment and surface acoustic wave devices of first and second comparative examples prepared for the purpose of comparison. In the surface acoustic wave device of the preferred embodiment, the IDT electrode 3 was a Cu film having a film thickness of about 0.12λ. In the first comparative example, the film thickness of the Cu film was about 0.10λ, and in the second comparative example, the film thickness of the Cu film was about 0.08λ.

Here, the specifications other than the film thickness of the IDT electrode 3 were as described below.

Regarding the surface acoustic wave device of the above-described preferred embodiment, an IDT electrode 3 having a thickness of about 0.12λ=about 248 nm was disposed on a $LiNbO_3$ substrate 2 represented by Euler angles of (0°, 30°, 0°), and a $SiO_2$ film of about 600 nm=about 0.29λ was provided as a second silicon oxide film 7, so that a 1.9-GHz-band surface acoustic wave resonator of one-port type was prepared. Here, λ of about 2.07 μm was used.

In the first comparative example, an IDT electrode was made of a Cu film having a film thickness of about 207 nm=about 0.10λ, and the film thickness of the second silicon oxide film 7 was about 600 nm=about 0.29λ. In the second comparative example, the thickness of an IDT electrode made of Cu was about 166 nm=about 0.08λ, and the film thickness of a $SiO_2$ film defining a second silicon oxide film was about 600 nm=about 0.29λ. The duty of each of the IDT electrodes was about 0.5.

A solid line indicates the results of the above-described preferred embodiment, a broken line indicates the results of the first comparative example, and an alternate long and short dash line indicates the results of the second comparative example.

As shown in FIG. 9, in the second comparative example, a large spurious response indicated by an arrow A occurs between a resonant frequency and an anti-resonant frequency, and in the first comparative example, a spurious response indicated by an arrow B occurs on the lower range side of a resonant frequency. These spurious responses are believed to be spurious responses caused by the SH wave. On the other hand, in the surface acoustic wave device 1 according to the above-described preferred embodiment, such a spurious response does not occur.

Surface acoustic wave devices were formed as in the above-described preferred embodiment except that the film thickness of the second silicon oxide film 7 in the surface acoustic wave device 1 was changed from about 0.34λ to about 0.29λ and about 0.24λ, for example. FIG. 10 shows the measurement results of the filter characteristics of these surface acoustic wave devices. As in the above-described preferred embodiment, a solid line indicates the results when the film thickness of the second silicon oxide film is about 0.34λ, a broken line indicates the results when the film thickness is about 0.29λ, and an alternate long and short dash line indicates the results when the film thickness is about 0.24λ.

As shown in FIG. 10, a spurious response is not observed in any of the surface acoustic wave devices and, therefore, a good resonant characteristic is obtained. Consequently, even when the film thickness of the second silicon oxide film made of $SiO_2$ varies, a spurious response does not occur, such that an outstanding resonant characteristic can be stably obtained.

In the above-described preferred embodiment, the Euler angles of the $LiNbO_3$ substrate are specified to be (0°, θ±5°, 0°). However, by experimentation, the present inventors discovered the following. With respect to the Euler angles of (Φ, θ, φ), it is sufficient that Φ is within the range of about 0°±5° and φ is within the range of about 0°±10°. In each case, results that are similar to the results obtained with the above-described preferred embodiment are obtained.

In the above-described preferred embodiment, the IDT electrode is made of Cu. However, in preferred embodiments of the present invention, it is sufficient that an electrode primarily including Cu is used. An adhesion layer having a relatively small thickness may be disposed under a main electrode layer made of Cu, or a thin protective electrode layer may be laminated on an electrode primarily including Cu. In these cases, it is sufficient that the thickness of the main electrode layer made of Cu is substantially equal to the thickness of the electrode.

Furthermore, preferred embodiments of the present invention can be applied to not only the above-described one-port surface acoustic wave resonators and band pass filter portions of duplexers, but also to various resonators and surface acoustic wave filters having various circuit configurations.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device utilizing a Rayleigh wave comprising:
   a LiNbO$_3$ substrate having Euler angles of (0°±5°, θ±5°, 0°±10°);
   an electrode disposed on the LiNbO$_3$ substrate and including an IDT electrode primarily including Cu;
   a first silicon oxide film disposed in a region other than a region in which the electrode is disposed, the first silicon oxide film having a film thickness substantially equal to the thickness of the electrode; and
   a second silicon oxide film arranged to cover the electrode and the first silicon oxide film; wherein
   the film thickness of the electrode is in a range of 0.12λ to 0.18λ, where λ represents the wavelength of a surface acoustic wave, and θ of the Euler angles of (0°±5°, θ±5°, 0°±10°) is specified to be within a range satisfying the following Formula (1):

$$\theta = 32.01 - 351.92 \times \exp(-T_{Cu}/0.0187) \quad \text{Formula (1)}$$

where $T_{Cu}$ is a value of the Cu electrode film thickness normalized with the wavelength λ.

2. The surface acoustic wave device according to claim 1, wherein the film thickness H of the second silicon oxide film is in a range of about 0.15λ to about 0.50λ.

3. The surface acoustic wave device according to claim 1, wherein a duty of the IDT electrode is about 0.50.

4. The surface acoustic wave device according to claim 1, wherein the film thickness H of the second silicon oxide film is in a range of about 0.20λ to about 0.40λ.

* * * * *